United States Patent
Iida et al.

(10) Patent No.: US 7,411,416 B2
(45) Date of Patent: Aug. 12, 2008

(54) TECHNOLOGY FOR SUPRESSING NOISE OF DATA BUS CIRCUIT

(75) Inventors: Hideyuki Iida, Kawasaki (JP); Yoshiro Tanaka, Kawasaki (JP); Keisuke Nakamura, Kawasaki (JP); Yosuke Konaka, Kawasaki (JP); Takayuki Niiyama, Kawasaki (JP); Daisuke Seki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 75 days.

(21) Appl. No.: 11/117,611

(22) Filed: Apr. 29, 2005

(65) Prior Publication Data

US 2006/0158215 A1    Jul. 20, 2006

(51) Int. Cl.
*H03K 17/16* (2006.01)
(52) U.S. Cl. .......................................... 326/30; 326/21
(58) Field of Classification Search ................ 326/30
See application file for complete search history.

(56) References Cited

U.S. PATENT DOCUMENTS 5,406,118 A * 4/1995 Saito ........................ 257/664
5,841,995 A * 11/1998 Ogawa ...................... 710/305
2005/0253622 A1* 11/2005 Dreps et al. .................. 326/31

FOREIGN PATENT DOCUMENTS

JP            3-235111           10/1991

OTHER PUBLICATIONS

Agilent Technologies☐☐Title: Agilent HDMP-1032A/1034A Transmitter/Receiver Chip Set Data Sheet☐☐Date: Aug. 16, 2001☐☐Pertinent pp. 1-31 (Examiner cited pp. 4, 12, and 28).*
Agilent Technologies☐☐Agilent HDMP-1032A/1034A Transmitter/Receiver Chip Set Data Sheet☐☐Pertinent Pages (all pages of Data Sheet)☐☐Date Aug. 16, 2001.*
Agilent Technologies, Inc., Agilent HDMP-1032A/1034A Transmitter/Receiver Chip Set Data Sheet, Aug. 16, 2001, pp. 1-31.*

* cited by examiner

*Primary Examiner*—Rexford Barnie
*Assistant Examiner*—Thienvu V Tran
(74) *Attorney, Agent, or Firm*—Westerman, Hattori, Daniels & Adrian, LLP.

(57) ABSTRACT

A data bus circuit connects a south bridge driven by a first voltage and a bay driven by a second voltage. The first voltage and the second voltage are different. The data bus circuit includes a data bus that electrically connects the south bridge and the bay, and a Thevenin termination circuit that is arranged on the data bus at a point. The Thevenin termination circuit maintains a voltage at the point substantially equal to the first voltage.

4 Claims, 5 Drawing Sheets

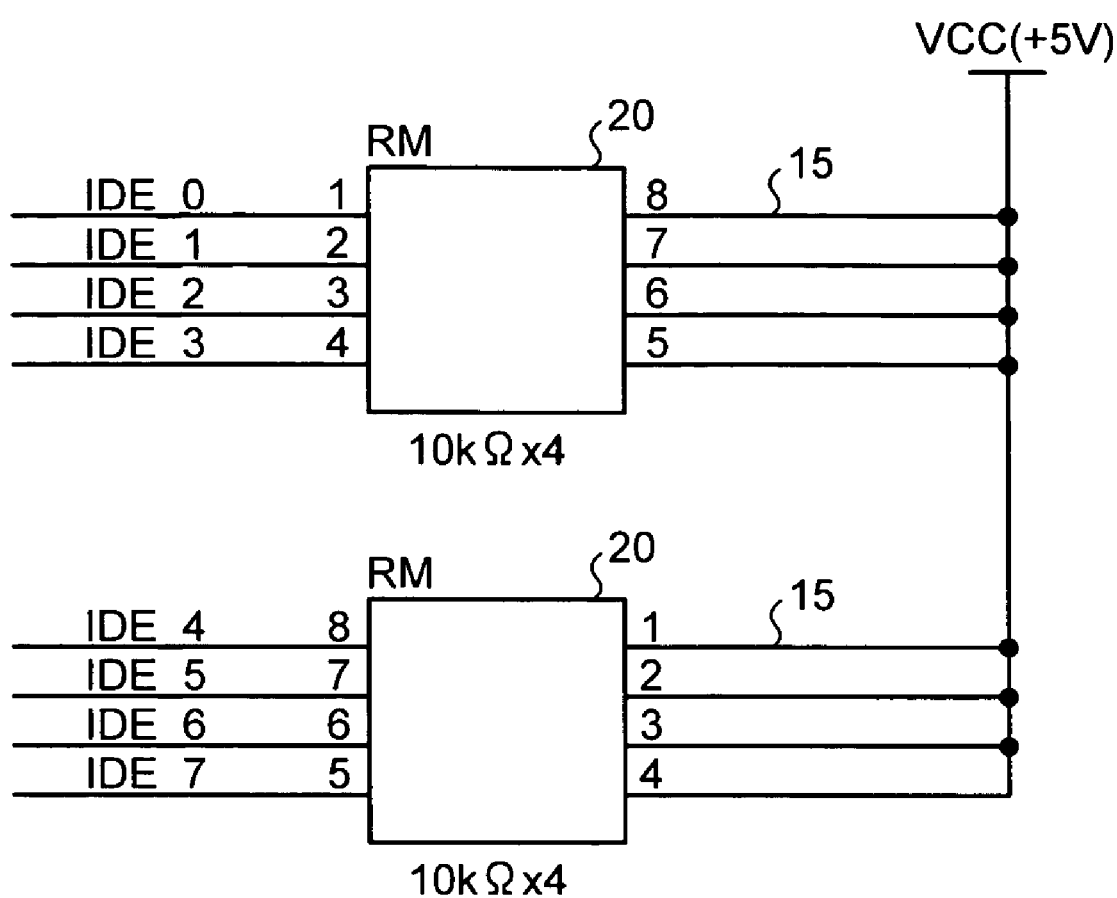

TECHNOLOGY FOR SUPRESSING NOISE OF DATA BUS CIRCUIT

BACKGROUND OF THE INVENTION

1) Field of the Invention

The present invention relates to eliminating noise of a data bus circuit provided on a mother board.

2) Description of the Related Art

Mother boards of personal computer/advanced technology (PC/AT) compatible machines are typically provided with a 16-signal-line integrated drive electronics (IDE) data bus. This data bus is arranged on the mother board between a south bridge and a bay.

The south bridge includes a transmitting side device, which is a series of chip sets that administer data passing between a central processing unit (CPU), a random access memory (RAM), and an expansion card. On the other hand, the bay includes a loading side device, such as a compact-disc read only memory (CD-ROM) drive and a floppy disk drive. The data bus electrically connects the transmitting side device and the loading side device, to form a path that transmits and receives data. A related technology is disclosed in Japanese Patent Application Laid Open No. H3-235111.

The data bus functions as an antenna and generates high-frequency noise near the bay. There are regulations that prohibit generation of high-frequency noise that can cause electromagnetic coherency. Specifically, operation of the data bus must not inhibit operation of other devices, or cause electromagnetic interference (EMI) that exceeds a predetermined level of interference and affects the human body.

Lot of High-frequency noise is generated when the transmitting side device and the loading side device are driven by different power sources of different voltages. The leakage of EMI to the outside can be prevented by adhering a gasket or a conductive cloth to a conductive surface of a frame ground (FG) that covers the bay, so as to shield the high-frequency noise emitted from the bay side of the data bus.

However, this method requires additional components and processing steps, which leads to increased cost and weight of the machine.

SUMMARY OF THE INVENTION

It is an object of the present invention to suppress noise of data bus circuits without additional components.

According to an aspect of the present invention, a data bus circuit connects a first device driven by a first voltage and a second device driven by a second voltage, wherein the first voltage and the second voltage are different. The data bus circuit further comprises a data bus that electrically connects the first device and the second device, and a Thevenin termination circuit that is arranged on the data bus at a point that is anywhere between the first device and the second device, wherein the Thevenin termination circuit has a configuration so that a voltage at the point is substantially equal to the first voltage.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 3 is a detailed circuit diagram of a conventional data bus circuit in a laptop computer of an older model;

DETAILED DESCRIPTION

Exemplary embodiments of the present invention will be described below with reference to accompanying drawings.

Figure 1:
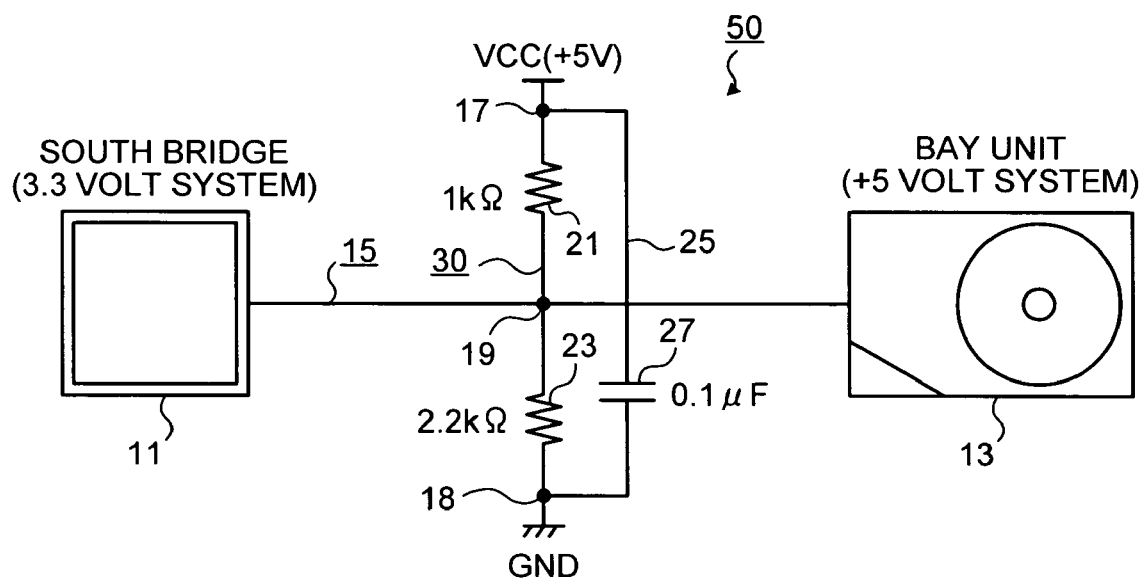
FIG. 1 is a circuit diagram of a data bus circuit according to an embodiment of the present invention.

FIG. 1 is a circuit diagram of a data bus circuit 50 according to an embodiment of the present invention. The data bus circuit 50 is arranged between a south bridge and a bay. The south bridge includes a transmitting side device 11, which is a series of chip sets that administer data passing between a CPU (not shown), a RAM (not shown), and an expansion card (not shown). The transmitting side device 11 is driven by a 3.3-volt-system power source (hereinafter, "first voltage"). On the other hand, the bay includes a loading side device 13, such as a CD-ROM drive and a floppy disk drive. The loading side device 13 is driven by a 5-volt-system power source (hereinafter, "second voltage").

The data bus circuit 50 includes a data bus 15 and a Thevenin termination circuit 30. The data bus 15 is an IDE bus with 16 signal lines (IDE_0, IDE_1, ..., IDE_15), and electrically connects the transmitting side device 11 and the loading side device 13. The Thevenin termination circuit 30 is arranged on the data bus 15 at a midpoint 19. The midpoint 19 can be anywhere between the transmitting side device 11 and the loading side device 13. The Thevenin termination circuit 30 includes a first resistance 21 located between the midpoint 19 and a high voltage terminal 17, and a second resistance 23 located between the midpoint 19 and a low voltage terminal 18. The high voltage terminal 17 is applied with the second voltage, and the low voltage terminal 18 is applied with a ground potential GND.

Resistances of the first resistance 21 and the second resistance 23 (i.e., amounts of pull-up resistance and pull-down resistance) are determined based on a ratio of the first voltage and the second voltage in such a manner that a voltage at the midpoint 19 is substantially equal to the first voltage. It is assumed here that the first resistance 21 is 1 kilo-ohm (kΩ), and the second resistance 23 is 2.2 kΩ.

A 0.1-microfarad (μF) bypass condenser 27 is arranged on a line 25 connecting the high voltage terminal 17 and the low voltage terminal 18. Therefore, the bypass condenser 27 is connected in parallel with the Thevenin termination circuit 30, between the high voltage terminal 17 and the low voltage terminal 18.

In the data bus circuit 50, the voltage at the midpoint 19 is substantially equal to the first voltage. Therefore, a signal waveform of the data bus 15 is shaped so as to suppress high-frequency noise.

In the Thevenin termination circuit 30, the first resistance 21 (1 kΩ) pulls up the high voltage terminal 17 side, and the second resistance 23 (2.2 kΩ) pulls down the low voltage terminal 18 side. Moreover, the bypass condenser 27 (0.1 μF) connects the high voltage terminal 17 and the low voltage terminal 18. In this configuration, the voltage at the midpoint 19 is obtained by the following equation:

$$5.0 \times 2.2k/(1k+2.2k) = 3.4375 \text{ volts} \quad (1).$$

To obtain a pull-down resistance $R_{down}$ with respect to a pull-up resistance $R_{up}$, the following equation is typically used. It is assumed that the first voltage (transmitting side) $V_d$ is less than the second voltage (loading side) $V_r$ (i.e., $V_d<V_r$).

$$R_{down}=R_{up}\times V_d/(V_r-V_d)\Omega \quad (2)$$

For example, when $R_{up}$=1 kΩ, then $R_{down}$=1.94 kΩ. However, in reality, $R_{down}$=2.2 kΩ) is selected.

The data bus circuit 50 is ideally provided for all of the 16 signal lines that generate high-frequency noise. However, harmful high-frequency noises can be suppressed by providing the data bus circuit 50 to only half of the signal lines (IDE_0, IDE_1, ..., IDE_7), as in an example shown in FIG. 2. Likewise, the bypass condenser 27 only needs to be provided to half of the signal lines in this example.

Figure 2:
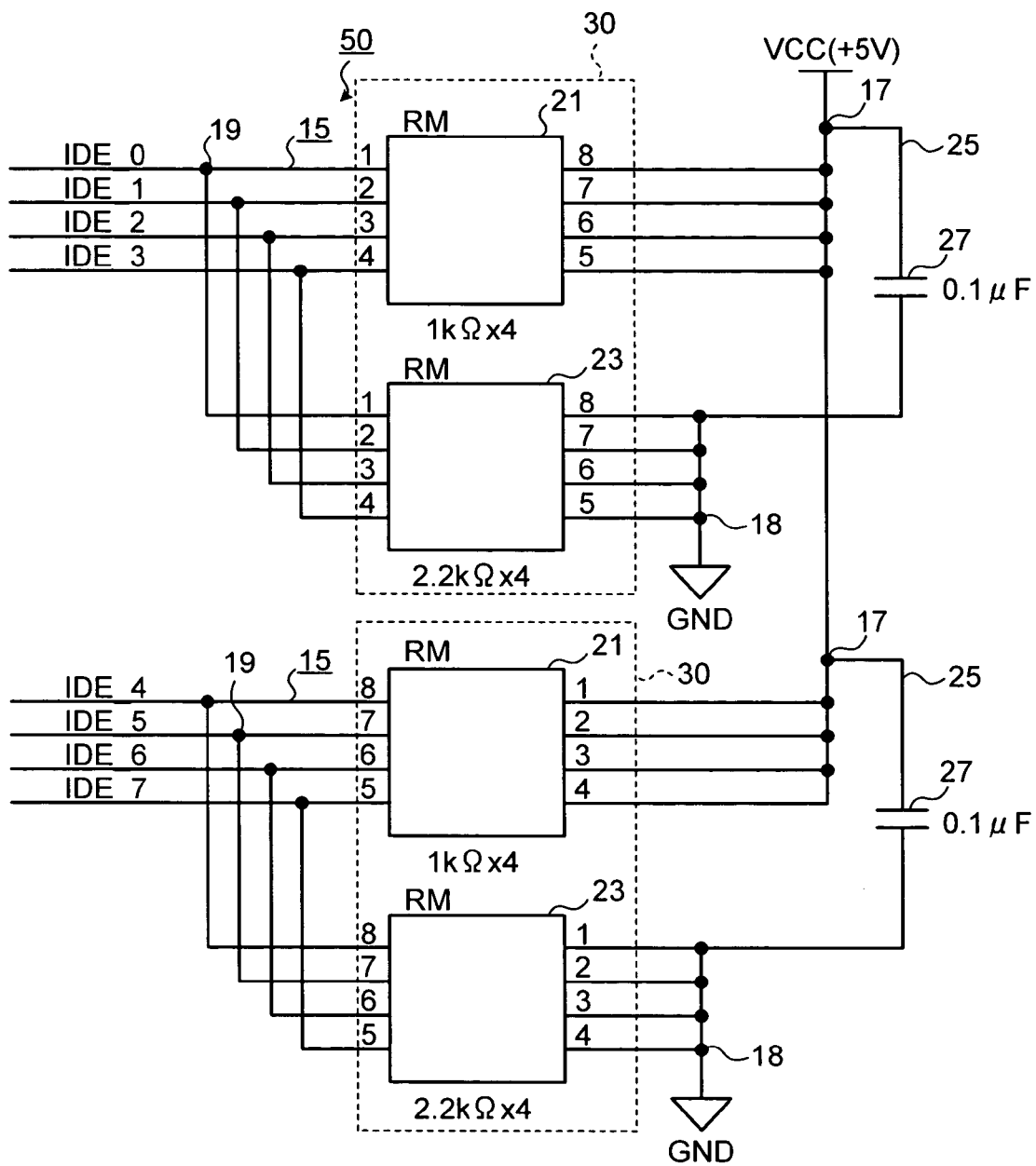
FIG. 2 is a detailed circuit diagram of the data bus circuit shown in FIG. 1 when the data bus circuit is used in a laptop computer.

FIG. 2 is a circuit diagram of the data bus circuit 50 in a laptop computer, which is actually slated to be manufactured. The Thevenin termination circuit 30 including the first resistance 21 and the second resistance 23 is provided corresponding to only eight signal lines (IDE_0, IDE_1, ..., IDE_7) in the data bus 15. The bypass condenser 27 is connected in parallel with the Thevenin termination circuit 30, between the high voltage terminal 17 and the low voltage terminal 18.

In the data bus 15, harmful noises are not necessarily generated by all 16 signal lines. In reality, the data bus 15 is wound around on a printed board (not shown) so that the 16 signal lines have different lengths respectively. In other words, a signal line on the outer side of a curvature is longer than a signal line on the inner side. Typically, longer signal lines are apt to generate low-frequency noise, whereas shorter signal lines are apt to generate high-frequency noise. Moreover, the types of noises generated by each of the signal lines are different depending on the size of the machine, structure, pattern position, shape, length, and so forth. Among these noises, only the harmful noises need to be eliminated. To achieve this object, the noises generated by each of the signal lines are measured beforehand. As a result of the measurement, when there is a specific signal line that generates a harmful noise, the Thevenin termination circuit 30 and the bypass condenser 27 are only provided for the corresponding signal line.

FIG. 3 is a circuit diagram of a conventional data bus circuit in a laptop computer of an older model. Because the conventional data bus circuit only includes one resistance 20, the voltage of the data bus 15 cannot be adjusted to be equal to the voltage of the transmitting side device 11. Therefore, harmful noises cannot be suppressed.

Figure 4A:
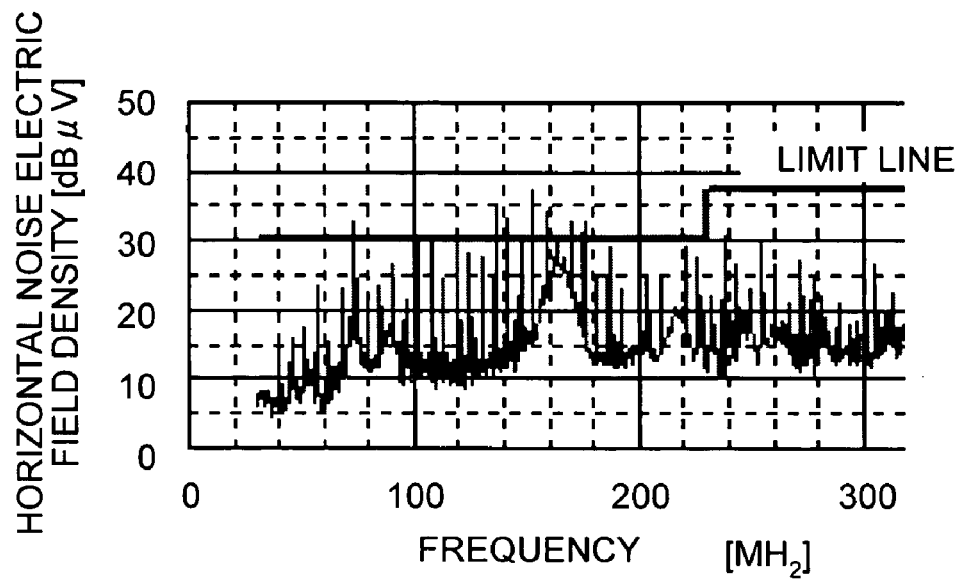
FIG. 4 is a graph that illustrates measurements of noises generated by a data bus in the data bus circuit according to the embodiment of the present invention.
Figure 4B:
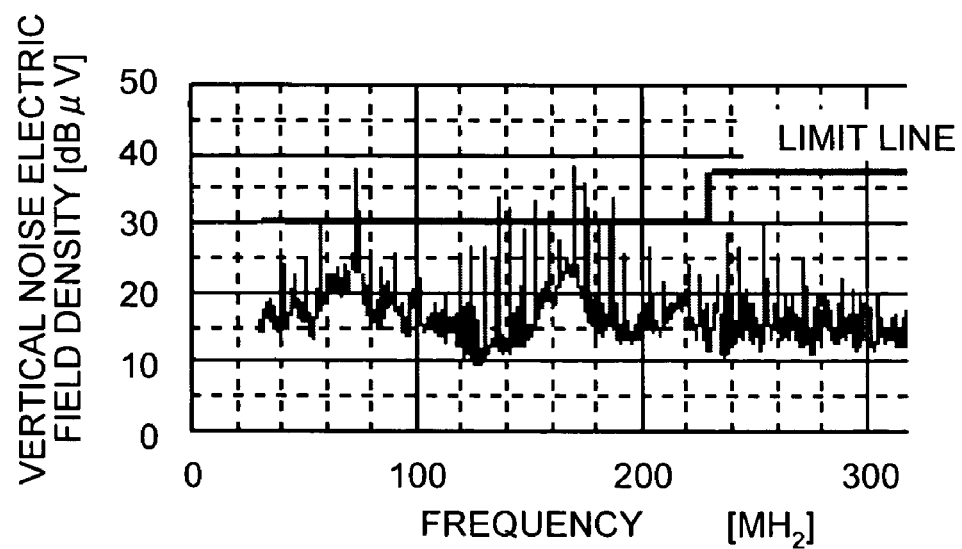
Figure 5A:
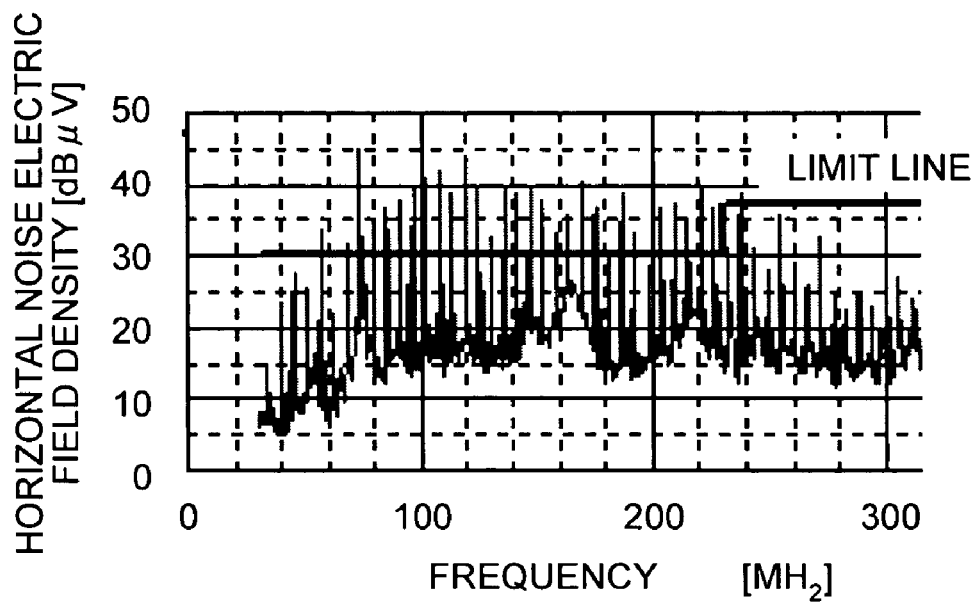
FIG. 5 is a graph that illustrates measurements of noises generated by a data bus in the conventional data bus circuit.
Figure 5B:
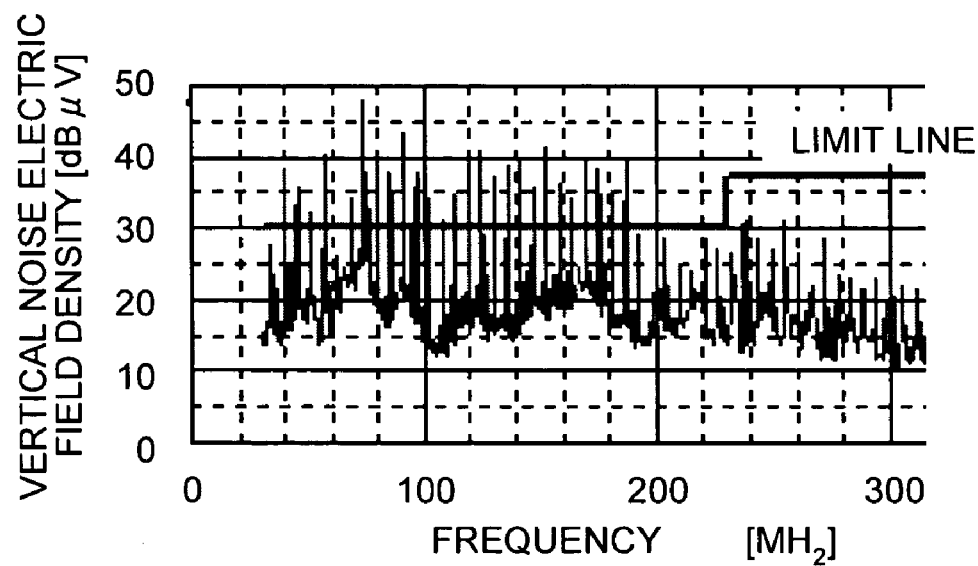

FIGS. 4A and 4B are graphs of noise generated by the data bus 15 in the data bus circuit 50 according to the embodiment. FIGS. 5A and 5B are graph of noise generated by a data bus in the conventional data bus circuit. In these graphs, electric field intensity (dBμV) is plotted on the vertical axis, and frequency (MHz) is plotted on the horizontal axis. FIGS. 4A and 5A represent horizontal noise and FIGS. 4B and 5B represent vertical noise.

There are legal or voluntary restrictions in many countries on the level of noises generated by data buses. Thick lines in the graphs indicate the limit line. The levels of the noise generated by the data bus 15 according to the present invention are substantially below the limit line (see FIGS. 4A and 4B), whereas most of the peaks of the noises generated by the conventional data bus exceed the limit line (see FIGS. 5A and 5B).

In this manner, according to the present invention, harmful high-frequency noises of data bus circuits are suppressed, without requiring additional components that lead to increased cost and weight.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. A data bus circuit that connects a first device driven by a first voltage and a second device driven by a second voltage, wherein the first voltage and the second voltage are different, comprising:
   a data bus that electrically connects the first device and the second device;
   a Thevenin termination circuit that is arranged on the data bus at a point that is anywhere between the first device and the second device, wherein the Thevenin termination circuit has a configuration so that a voltage at the point is substantially equal to the first voltage; and
   a bypass condenser that is connected in parallel with the Thevenin termination circuit between the high voltage terminal and the low voltage terminal, wherein
   the Thevenin termination circuit includes a first resistance provided between the point and a high voltage terminal and a second resistance provided between the point and a low voltage terminal, wherein
   resistances of the first resistance and the second resistance are determined based on a ratio of the first voltage and the second voltage so that the voltage at the point is substantially equal to the first voltage, wherein
   the data bus includes a plurality of signal lines, and the Thevenin termination circuit and the bypass condenser are provided corresponding to at least one of the signal lines, wherein
   the data bus includes 16 signal lines, and the Thevenin termination circuit and the bypass condenser are provided corresponding to 8 signal lines.

2. The data bus circuit according to claim 1, wherein the high voltage terminal is applied with the second voltage and the low voltage terminal is applied with a ground potential.

3. The data bus circuit according to claim 1, wherein the first device is a south bridge, which is an LSI chip arranged on a motherboard of a computer, and the second device is a bay, which is a device connected to the computer.

4. The data bus circuit according to claim 1, wherein the first voltage is 3.3 volts, the second voltage is 5 volts, the high voltage terminal is at 5 volts, the low voltage terminal is at ground potential, the first resistance is 1 kilo-ohm, and the second resistance is 2.2 kilo-ohms.

* * * * *

UNITED STATES PATENT AND TRADEMARK OFFICE
CERTIFICATE OF CORRECTION

PATENT NO. : 7,411,416 B2
APPLICATION NO. : 11/117611
DATED : August 12, 2008
INVENTOR(S) : Hideyuki Iida et al.

It is certified that error appears in the above-identified patent and that said Letters Patent is hereby corrected as shown below:

On the cover page insert:

item --(30) Foreign Application Priority Data (JP)------2005-008035    Jan. 14, 2005--

Signed and Sealed this

Twenty-eighth Day of April, 2009

JOHN DOLL
*Acting Director of the United States Patent and Trademark Office*